United States Patent
Jang et al.

(10) Patent No.: US 10,068,038 B2
(45) Date of Patent: Sep. 4, 2018

(54) SEMICONDUCTOR PROCESS SIMULATION DEVICE AND SIMULATION METHOD THEREOF

(71) Applicant: SAMSUNG ELECTRONICS CO., LTD., Suwon-si, Gyeonggi-Do (KR)

(72) Inventors: Sung-Hwan Jang, Bucheon-si (KR); Sungchul Kim, Hwaseong-si (KR); Jiseong Doh, Hwaseong-si (KR); Wonsok Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 15/277,480

(22) Filed: Sep. 27, 2016

(65) Prior Publication Data
US 2017/0109460 A1    Apr. 20, 2017

(30) Foreign Application Priority Data
Oct. 16, 2015   (KR) .......................... 10-2015-0144842

(51) Int. Cl.
*G06F 17/50*   (2006.01)

(52) U.S. Cl.
CPC ...... *G06F 17/5009* (2013.01); *G06F 17/5081* (2013.01)

(58) Field of Classification Search
CPC .................................................. G06F 17/5009
USPC ......................................................... 716/112
See application file for complete search history.

(56) References Cited

U.S. PATENT DOCUMENTS

| | | | |
|---|---|---|---|
| 5,096,841 A * | 3/1992 | Miura | H01L 29/6659 250/492.2 |
| 5,912,824 A | 6/1999 | Sawahata | |
| 6,099,574 A * | 8/2000 | Fukuda | G06F 17/5018 703/14 |
| 6,212,487 B1 * | 4/2001 | Sakamoto | G06F 17/5018 703/12 |
| 6,574,786 B1 | 6/2003 | Pohlenz et al. | |
| 7,424,411 B2 | 9/2008 | Ito | |
| 8,111,376 B2 | 2/2012 | Adel et al. | |
| 8,296,687 B2 | 10/2012 | Strang et al. | |
| 8,718,986 B2 | 5/2014 | Suzuki | |
| 2005/0218344 A1 * | 10/2005 | Starcher | H01J 37/026 250/492.21 |
| 2009/0306913 A1 * | 12/2009 | Suzuki | H01L 22/12 702/57 |
| 2011/0295571 A1 * | 12/2011 | Suzuki | H01L 21/26513 703/2 |

FOREIGN PATENT DOCUMENTS
KR   1019960019508 A   6/1996

* cited by examiner

Primary Examiner — Suchin Parihar
(74) Attorney, Agent, or Firm — Volentine, Whitt & Francos, PLLC

(57) ABSTRACT

A semiconductor process simulation method includes classifying a semiconductor process simulation into a plurality of blocks based on an annealing simulation, performing a shape simulation corresponding to a block selected from the plurality of blocks, and performing at least two ion implantation simulations among a plurality of ion implantation simulations corresponding to the selected block in parallel, based on result data of the shape simulation corresponding to the selected block.

20 Claims, 11 Drawing Sheets

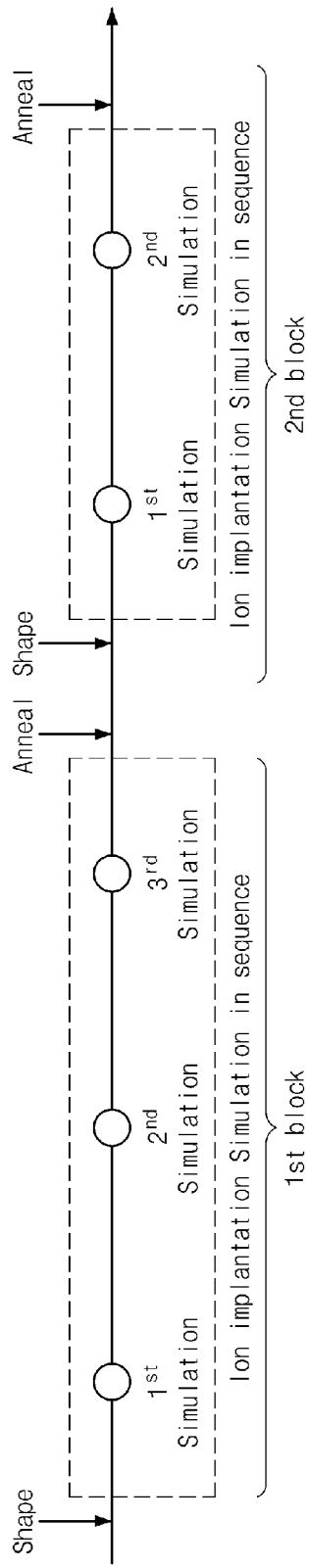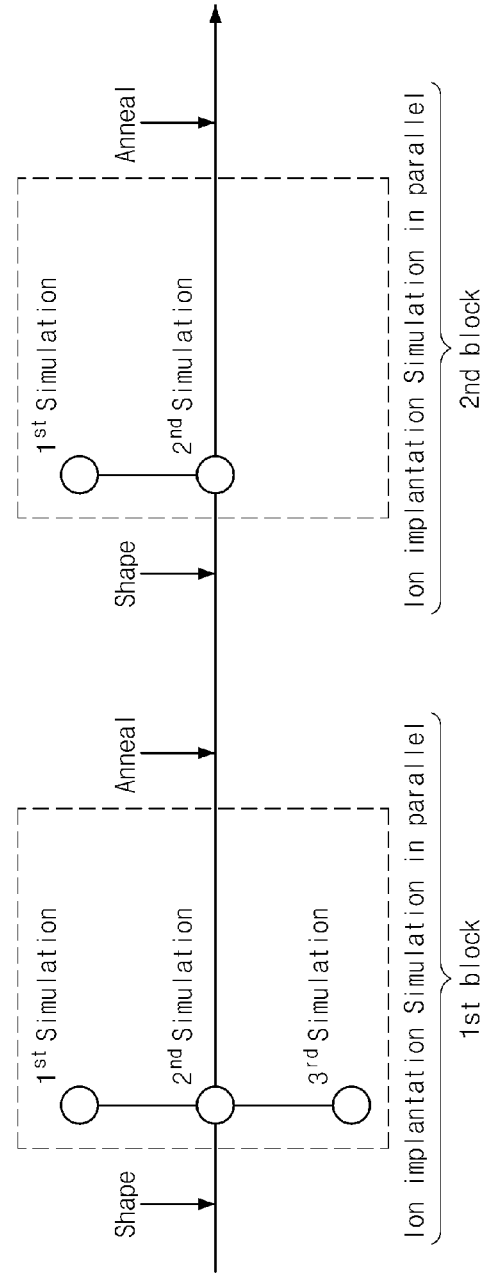

SEMICONDUCTOR PROCESS SIMULATION DEVICE AND SIMULATION METHOD THEREOF

CROSS-REFERENCE TO RELATED APPLICATIONS

A claim for priority under 35 U.S.C. § 119 is made to Korean Patent Application No. 10-2015-0144842 filed Oct. 16, 2015, in the Korean Intellectual Property Office, the entire contents of which are hereby incorporated by reference.

BACKGROUND

Embodiments of the disclosure relate to a semiconductor device, and in particular, to a device simulating a semiconductor process and a simulation method thereof.

With the high integration and miniaturization of semiconductor devices, a demand for semiconductor process simulation based on physical simulation is increasing to overcome the limits of semiconductor processes and devices and to reduce a test cost.

Conventional semiconductor progress simulation is made according to a semiconductor progress sequence. For this reason, computation of each step of the semiconductor process simulation is made based on result information of one or more previous steps. Since simulation steps progress according to an actual semiconductor process sequence, a total time taken to perform the semiconductor process simulation is the same as the sum of the simulation times of the steps.

However, as a semiconductor device becomes more highly integrated and miniaturized, there is gradually increasing the amount of time taken to perform a simulation operation using the above-described semiconductor process simulation method. Accordingly, there is required a semiconductor process simulation method and device capable of shortening a simulation time.

SUMMARY

Embodiments of the disclosure provide a semiconductor process simulation device, which is capable of shortening a simulation time, and a simulation method thereof.

One aspect of embodiments of the disclosure is directed to provide a semiconductor process simulation method. The method may include classifying a semiconductor process simulation into a plurality of blocks based on an annealing simulation, performing a shape simulation corresponding to a block selected from the plurality of blocks, and performing at least two ion implantation simulations among a plurality of ion implantation simulations corresponding to the selected block in parallel, based on result data of the shape simulation corresponding to the selected block.

Another aspect of embodiments of the disclosure is directed to provide a semiconductor process simulation device, which includes an input data base configured to store input data needed to perform a semiconductor process simulation. An output data base is configured to store output data for an execution result of the semiconductor process simulation. A process simulator is configured to perform the semiconductor process simulation using on the input data base and the output data base. The process simulator may classify the semiconductor process simulation into a plurality of blocks based on an annealing simulation and may perform at least two among a plurality of ion implantation simulations corresponding to a block in parallel.

Still another aspect of embodiments of the disclosure is directed to provide a computing device which performs a semiconductor process simulation. The computing device may include an input device configured to receive input data for the semiconductor process simulation. An output device is configured to receive result data of the semiconductor process simulation. A memory is configured to store a program routine for the semiconductor process simulation. A processor is connected to the input device, the output device, and the memory and is configured to control the program routine. The program routine stored in the memory may perform at least two ion implantation simulations among a plurality of ion implantation simulations included in the semiconductor process simulation in parallel.

Still another aspect of embodiments of the disclosure is directed to provide a semiconductor process simulation method. The method includes classifying a semiconductor process simulation into a sequence of blocks based on an annealing simulation; identifying a first ion implantation simulation, for a selected one of the sequence of blocks, whose reliability is dependent upon information acquired from executing a second ion implantation simulation; performing the second ion implantation simulation and a third ion implantation simulation in parallel; and performing the first ion implantation simulation using information acquired from performing the second ion implantation simulation.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 6 and 7 are diagrams illustrating a simulation method according to an embodiment of the disclosure and a conventional simulation method;

DETAILED DESCRIPTION

Below, embodiments of the disclosure will be described with reference to the accompanying drawings.

Figure 1:
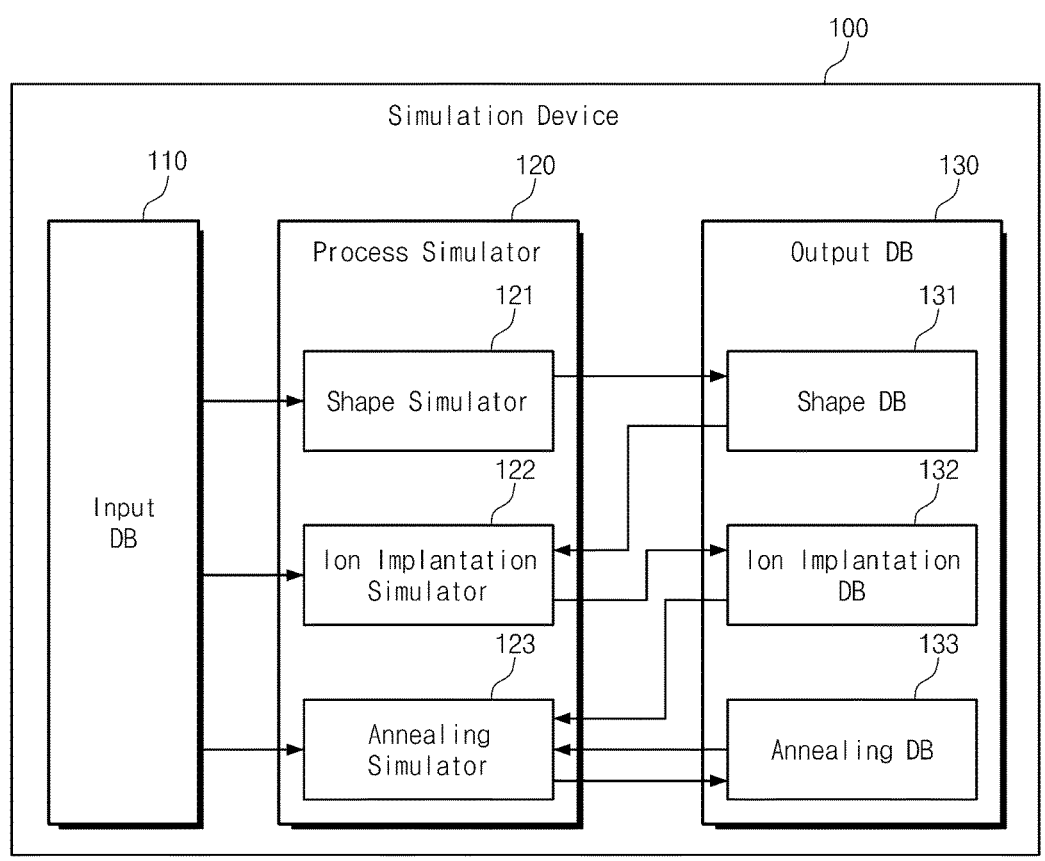
FIG. 1 is a block diagram illustrating a simulation device according to an embodiment of the disclosure.

FIG. 1 is a block diagram illustrating a simulation device 100 according to an embodiment of the disclosure. Referring to FIG. 1, a simulation device 100 may include an input data base 110, a process simulator 120, and an output data base 130.

The input data base 110 may store information needed to perform the semiconductor process simulation. For example, the input data base 110 may store information associated with material, structure, process and calibration, which are needed to perform the semiconductor process simulation.

The information associated with the material may include, for example, data information about a material needed for a semiconductor manufacturing procedure, such as a name, an attribute, and the like of the material. The information associated with the structure may include, for example, information about the size or layout of a device such as a thickness, a length, and the like of an oxide layer. The information associated with the process may include, for example, a process condition for simulation, such as a process sequence and the like. The information associated with the calibration may include, for example, information associated with a physical or experimental model equation used for the simulation or a coefficient of a corresponding model equation.

The process simulator 120 may perform a semiconductor process simulation operation based on the semiconductor process simulation information stored in the input data base 110. In detail, the process simulator 120 may classify a semiconductor process simulation flow into a plurality of blocks based on an annealing simulation. In this case, each block classified by the process simulator 120 may be implemented, for example, to include at least one shape simulation, at least one ion implantation simulation, and at least one annealing simulation.

After classifying the semiconductor process simulation flow, the process simulator may select a block among the plurality of blocks based on a simulation sequence and may perform a simulation operation about the selected block. As illustrated in FIG. 1, the process simulator 120 may include a shape simulator 121, an ion implantation simulator 122, and an annealing simulator 123.

The shape simulator 121 may obtain information about a shape and/or a structure, needed to simulate the selected block, from the input data base 110. The shape simulator 121 may obtain from the input data base 110 the following information about a shape and/or a structure of a semiconductor device to be manufactured at the selected block: oxidation, deposition, masking, and etching.

The shape simulator 121 may perform shape simulation about the selected block based on the received shape and/or structure information and may store the result data of the shape simulation about the selected block in a shape data base 131 of the output data base 130.

The ion implantation simulator 122 may obtain information about the shape and/or the structure of the selected block from the shape input data base 131. The ion implantation simulator 122 may obtain, from the shape data base 131, structure information about a semiconductor device which is being manufactured at a step before an ion implantation process is performed.

Furthermore, the ion implantation simulator 122 may obtain information about ion implantation of the selected block from the shape input data base 110. The ion implantation simulator 122 may obtain from the input data base 110, for example, information about a beam current, an acceleration voltage, an ion implantation time, and the like.

The shape simulator 122 may perform ion implantation simulation about the selected block based on shape information and ion implantation information and may store the result data of the ion implantation simulation of the selected block in an ion implantation data base 132 of the output data base 130.

According to an embodiment, the selected block may include a plurality of ion implantation simulations. In this case, the ion implantation simulator 122 may perform at least two among the plurality of ion implantation simulations in parallel. For example, the ion implantation simulator 122 may be implemented with a multi-core or a multi-core processor, and at least two ion implantation simulations may be respectively assigned to different cores for execution. As at least two ion implantation simulations are performed in parallel, the ion implantation simulator 122 may minimize a time needed to perform the ion implantation simulation. Meanwhile, pieces of result data of the at least two ion implantation simulations performed in parallel may be respectively stored in the ion implantation data base 132.

Continuing to refer to FIG. 1, the annealing simulator 123 may obtain the result data of the ion implantation simulation for the selected block from the ion implantation data base 132. Furthermore, the annealing simulator 123 may obtain result data of an annealing simulation for a previous block from the ion implantation data base 133. Here, the previous block may refer to a block where a simulation operation is performed at a step before performing a simulation operation of a currently selected block.

The annealing simulator 123 may perform annealing simulation based on both result data of the ion implantation simulation about a currently selected block and result data of an annealing simulation about a previous block. Afterwards, the annealing simulator 123 may store a result of the annealing simulation about a selected block in an annealing data base 133 of the output data base 130.

As described above, the simulation device 100 may classify the semiconductor process simulation flow into a plurality of blocks on the basis of an annealing simulation. Furthermore, the simulation device 100 may simultaneously perform at least two among a plurality of ion implantation simulations to be performed at each block regardless of a sequence, thereby making it possible for the simulation device 100 of FIG. 1 to shorten a time taken to perform a simulation.

Figure 2:
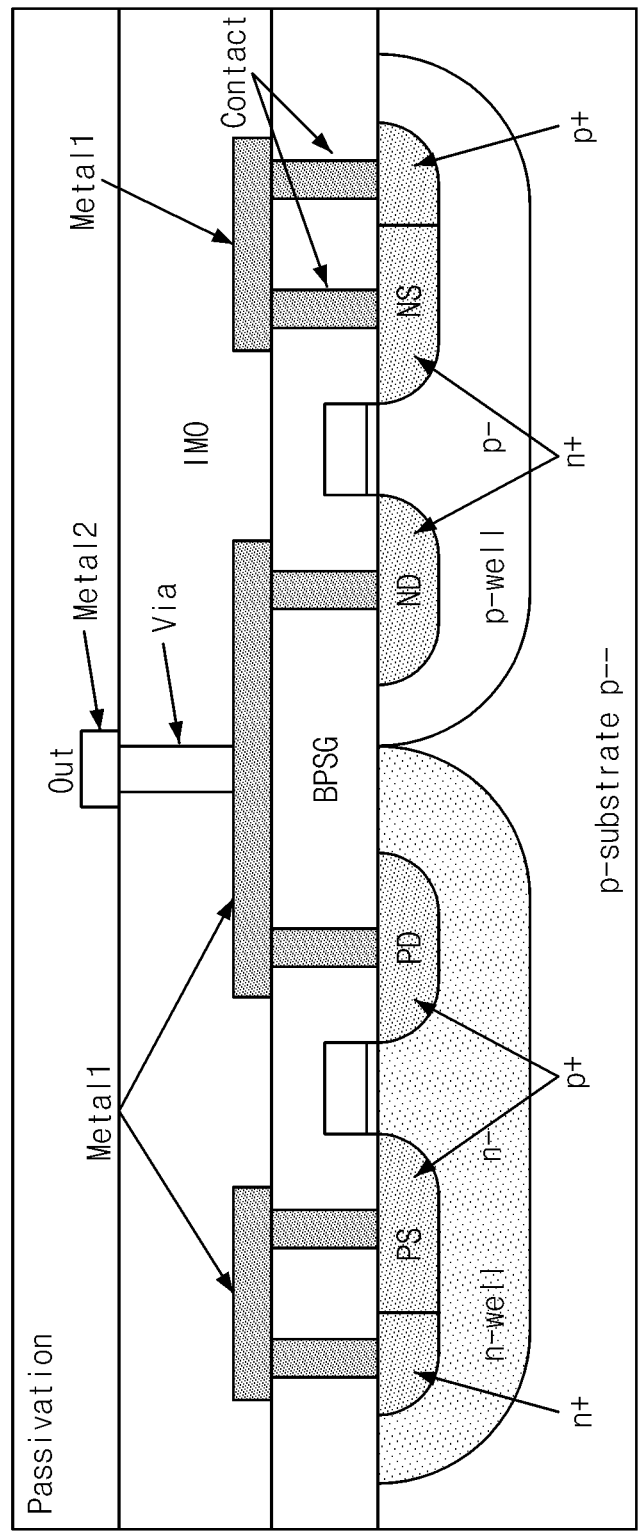
FIGS. 2 to 4 are cross-sectional views illustrating a semiconductor device under semiconductor process simulation according to an embodiment of the disclosure.
Figure 3:
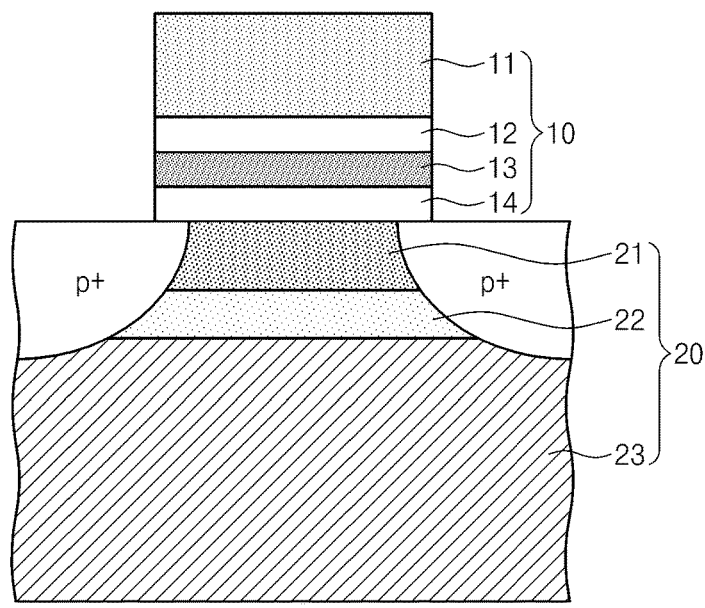
Figure 4:
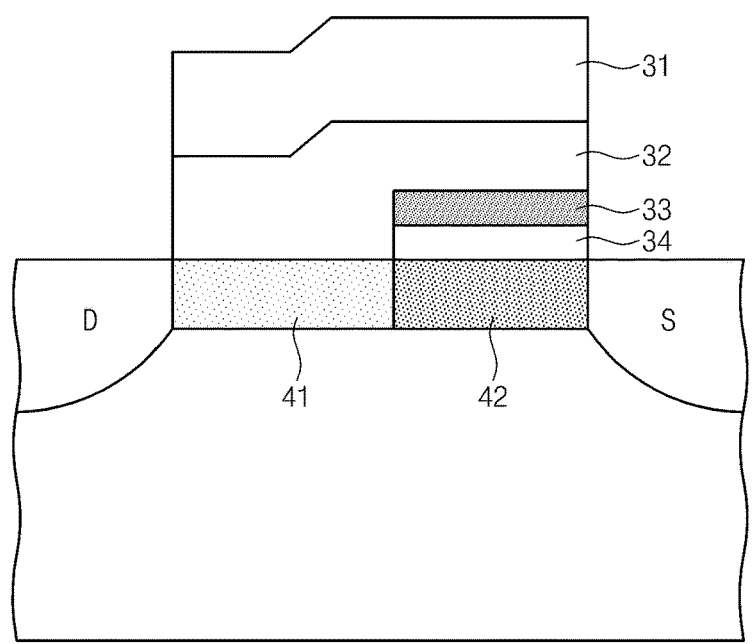

FIGS. 2 to 4 are cross-sectional views illustrating a semiconductor device under semiconductor process simulation according to an embodiment of the disclosure.

One hundred or more process steps may be performed to manufacture a semiconductor device illustrated in FIG. 2, and a conventional semiconductor process simulation may perform a simulation operation based on a sequence of actual process steps. In some cases, a time taken to perform an ion implantation simulation step among simulation steps included in the semiconductor process simulation may be longer than a time taken to perform each of the others. The reason may be that the ion implantation simulation is composed of a plurality of steps.

For example, to enhance the reliability of an erase operation, a nonvolatile memory device including a charge trap layer 13, being provided between two insulating layers 12 and 14, may be implemented such that an active area 20 has a plurality of doping layers 21, 22, and 23 of different concentrations, as illustrated in FIG. 3. In this case, the conventional semiconductor process simulation may perform at least three ion implantation simulations in a given sequence to form an active area.

For another example, to enhance the sensing margin of program and erase operations, a nonvolatile memory device including a charge trap layer 33 illustrated in FIG. 4 may be implemented such that a channel area 41 under a tunneling layer 32 and a channel area 42 under a gate insulating layer 34 have different concentrations from each other. A gate electrode 31 may be provided on the tunneling layer 32. In this case, the conventional semiconductor process simulation may perform at least two ion implantation simulations in a given sequence to form a channel area.

As described above, the conventional semiconductor process simulation may not only perform a simulation in an actual semiconductor process sequence, but it may also perform a plurality of simulations included in one ion implantation simulation in a given sequence. Accordingly, the conventional semiconductor process simulation may be problematical in that a lot of simulation time is required.

To solve the above-described issue, a simulation method according to an embodiment of the disclosure may simultaneously perform a plurality of simulations included in one ion implantation simulation regardless of a sequence, thereby making it possible to shorten a time taken to perform a simulation.

Figure 5:
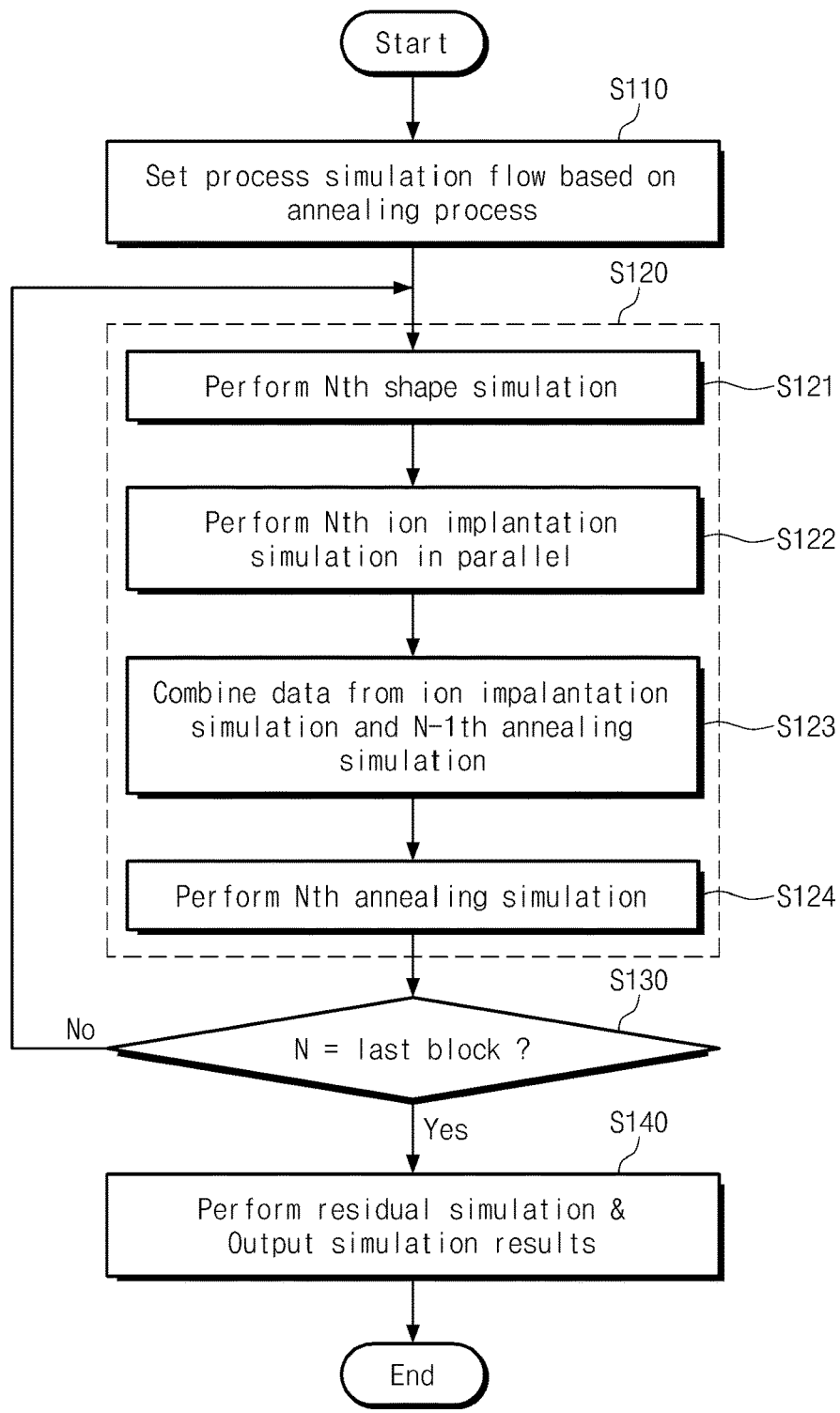
FIG. 5 is a flow chart for describing a simulation method according to an embodiment of the disclosure.

FIG. 5 is a flow chart for describing a simulation method according to an embodiment of the disclosure. A simulation method according to an embodiment of the disclosure will be described with reference to FIGS. 1 to 5.

In step S110, the process simulator 120 may establish a semiconductor process simulation flow based on an annealing simulation. In other words, the process simulator 120 may classify the semiconductor process simulation flow into a plurality of blocks based on the annealing simulation.

In more detail, the semiconductor process simulation may be simplified in the form of an iteration of "a shape simulation, an ion implantation simulation, and an annealing simulation" based on the annealing simulation.

For example, a simulation flow for forming a semiconductor device of FIG. 2 may include initial oxidation, nitride deposition, n-well masking, nitride etching, n-well ion implantation, n-well annealing, n-well oxidation, nitride strip, p-well ion implantation, p-well annealing, oxide layer etching, nitride deposition, PR coating, active masking, nitride etching, PR strip, field oxidation, nitride strip, poly deposition, poly doping, poly masking, n+ ion implantation, n+ annealing, p+ annealing, PR strip, source/drain re-oxidation, BPSG deposition, contact masking, contact etching, PR strip, metal-1 deposition, metal-1 masking, metal-1 etching, PR strip, IMO deposition, PR coating, via masking, IMO etching, PR strip, metal-2 deposition, metal-2 masking, metal-2 etching, PR strip, passivation, pad opening, and the like.

In the semiconductor process simulation, a similar process may be repeated based on an annealing simulation through which semiconductor defects decrease in concentration. Accordingly, the semiconductor simulation flow may be classified into "shape simulation, n-well ion implantation simulation, n-well annealing simulation", "shape simulation, p-well ion implantation simulation, p-well annealing simulation", "shape simulation, n+ ion implantation simulation, n+ annealing simulation", and "shape simulation, p+ ion implantation simulation, p+ annealing simulation", based on the annealing simulation.

In this case, the process simulator 120 may define, for example, "shape simulation, n-well ion implantation simulation, n-well annealing simulation" as a first block, "shape simulation, p-well ion implantation simulation, p-well annealing simulation" as a second block, "shape simulation, n+ ion implantation simulation, n+ annealing simulation" as a third block, and "shape simulation, p+ ion implantation simulation, p+ annealing simulation" as a fourth block.

In step S120, the process simulator 120 may perform a simulation operation about a selected block. For descriptive convenience, below, it may be assumed that a simulation operation about the second block is performed.

In detail, in step S121, the shape simulator 121 may perform a shape simulation corresponding to an N-th block. For example, the shape simulator 121 may perform an n-well oxidation simulation and a nitride strip simulation to implement a shape corresponding to the second block. Afterwards, the shape simulator 121 may store shape simulation result data in the shape data base 131.

In step S122, the ion implantation simulator 122 may perform an ion implantation simulation corresponding to the N-th block. For example, the ion implantation simulator 122 may perform the p-well ion implantation simulation corresponding to the second block. As described with reference to FIGS. 3 and 4, the p-well ion implantation simulation may include a plurality of simulations. In this case, the ion implantation simulator 122 may perform a plurality of simulations in the p-well ion implantation simulation at the same time to shorten a simulation time. Afterwards, the ion implantation simulator 122 may store result data about the plurality of simulations in the ion implantation data base 132.

In step S123, the annealing simulator 123 may obtain the ion implantation simulation result data for the N-th block from the ion implantation data base 132 and may obtain (N−1)-th annealing simulation result data from the annealing data base 133. For example, the annealing simulator 123 may obtain p-well ion implantation result data corresponding to the second block and n-well annealing result data corresponding to the first block. Afterwards, the annealing simulator 123 may combine the p-well ion implantation result data and the n-well annealing result data to generate data about an inactivated impurity distribution and a defect distribution.

In step S124, the annealing simulator 123 may perform an annealing operation about the N-th block. For example, the annealing simulator 123 may perform a simulation to cure defects due to ion implantation and electrically activating impurities by performing an annealing operation for the second block. Afterwards, the annealing simulator 123 may store annealing simulation result data about the second block in the annealing data base 133.

In step S130, the process simulator 120 may determine whether the selected block is the last block. If the selected block is not the last block, the process simulator 120 may perform a simulation for a next block. For example, the semiconductor process simulation flow is composed of a total of four blocks; if a selected block is a second block, the process simulator 120 may perform a simulation operation for the third block.

If the selected block is the last block, the process simulator 120 may perform remaining simulations such as metal deposition and the like and may output simulation results (S140).

FIGS. 6 and 7 are diagrams illustrating a simulation method according to each of an embodiment of the disclosure and a conventional simulation method. As illustrated in FIG. 6, a conventional simulation method may sequentially perform a plurality of simulations included in the ion implantation simulation. In contrast, as illustrated in FIG. 7, a conventional simulation method according to an embodiment of the disclosure may simultaneously perform a plurality of simulations included in the ion implantation simulation, regardless of a sequence of the simulations. Accordingly, the simulation method according to an embodiment of the disclosure may provide an enhanced simulation speed compared with the conventional simulation method.

For example, the ion implantation simulator 122 may simultaneously perform first, second, and third ion implantation simulations for a first block. Similarly, the ion implantation simulator 122 may simultaneously perform first and second ion implantation simulations for a second block.

However, the scope and spirit of the disclosure may not be limited thereto. For example, the simulation device of FIG. 1 may not only perform a plurality of simulations included in the ion implantation simulation at the same time, but it may also simultaneously perform simulation operations for at least two blocks.

For example, the ion implantation simulator 122 may perform an ion implantation simulation for a second block while also performing an ion implantation simulation for a first block. For another example, the ion implantation simulator 122 may perform the ion implantation simulation for the second block while also performing the ion implantation simulation for a third block. As simulation operations for at least two blocks are performed at the same time, the simulation device 100 of FIG. 1 may shorten a time taken to perform a simulation.

Figure 8:
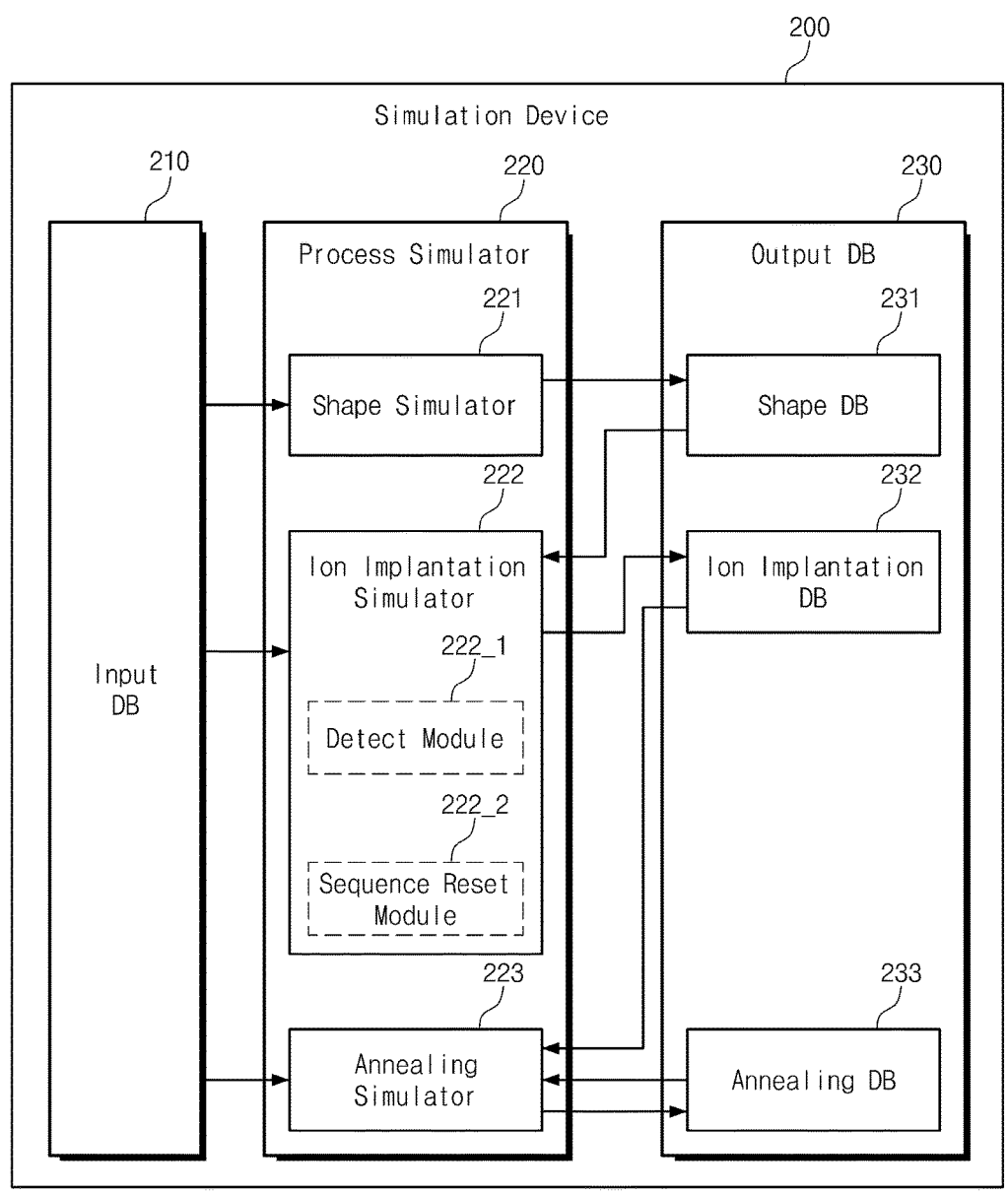
FIG. 8 is a block diagram illustrating a simulation device according to another embodiment of the disclosure.

FIG. 8 is a block diagram illustrating a simulation device 200 according to another embodiment of the disclosure. A simulation device 200 of FIG. 8 may be similar to the simulation device 100 of FIG. 1, and a description thereof is thus omitted. For example, input database 210, process simulator 220, shape simulator 221, ion implantation simulator 222, annealing simulator 223, output database 230, shape database 231, ion implantation database 232, and annealing database 233 illustrated by FIG. 8 operate similarly to input database 110, process simulator 120, shape simulator 121, ion implantation simulator 122, annealing simulator 123, output database 130, shape database 131, ion implantation database 132, and annealing database 133 illustrated by FIG. 1. For descriptive convenience, a difference between the simulation devices 100 and 200 will be described, and the same or similar description is thus omitted.

Unlike the simulation device 100 of FIG. 1, an ion implantation simulator 222 of the simulation device 200 of FIG. 8 may further include a detect module 222_1 and a sequence reset module 222_2. The detect module 222_1 and the sequence reset module 222_2 may be provided to enhance the accuracy of the ion implantation simulation.

If any simulation among a plurality of simulations included in the ion implantation simulation uses a high dose of ions, a lot of defects may occur. This may cause a change of result data of a following simulation, that is, an impurity distribution. Accordingly, to enhance the reliability of the ion implantation simulation, it may be necessary to determine whether the number of defects exceeds a reference during any simulation among the plurality of simulations included in the ion implantation simulation. If there exists a simulation in which the number of defects exceeds the reference, a sequence may be reset such that the simulation is performed prior to a following simulation. This may be made to apply a change of an impurity distribution, which is due to a lot of defects, to a following simulation by performing the simulation having more defects than the reference number prior to a following simulation.

To perform the function, the ion implantation simulator 222 of FIG. 8 may include the detect module 222_1 and the sequence reset module 222_2.

The detect module 222_1 may determine whether there exists a simulation, in which the number of defects is more than the reference, from among the plurality of simulations included in the ion implantation simulation. If a simulation in which the number of defects is more than the reference exists, the sequence reset module 222_2 may reset the sequence such that the relevant simulation is performed prior to a following simulation, and thus the simulation device 200 may enhance the reliability of the ion implantation simulation as well as the simulation speed.

Figure 9:
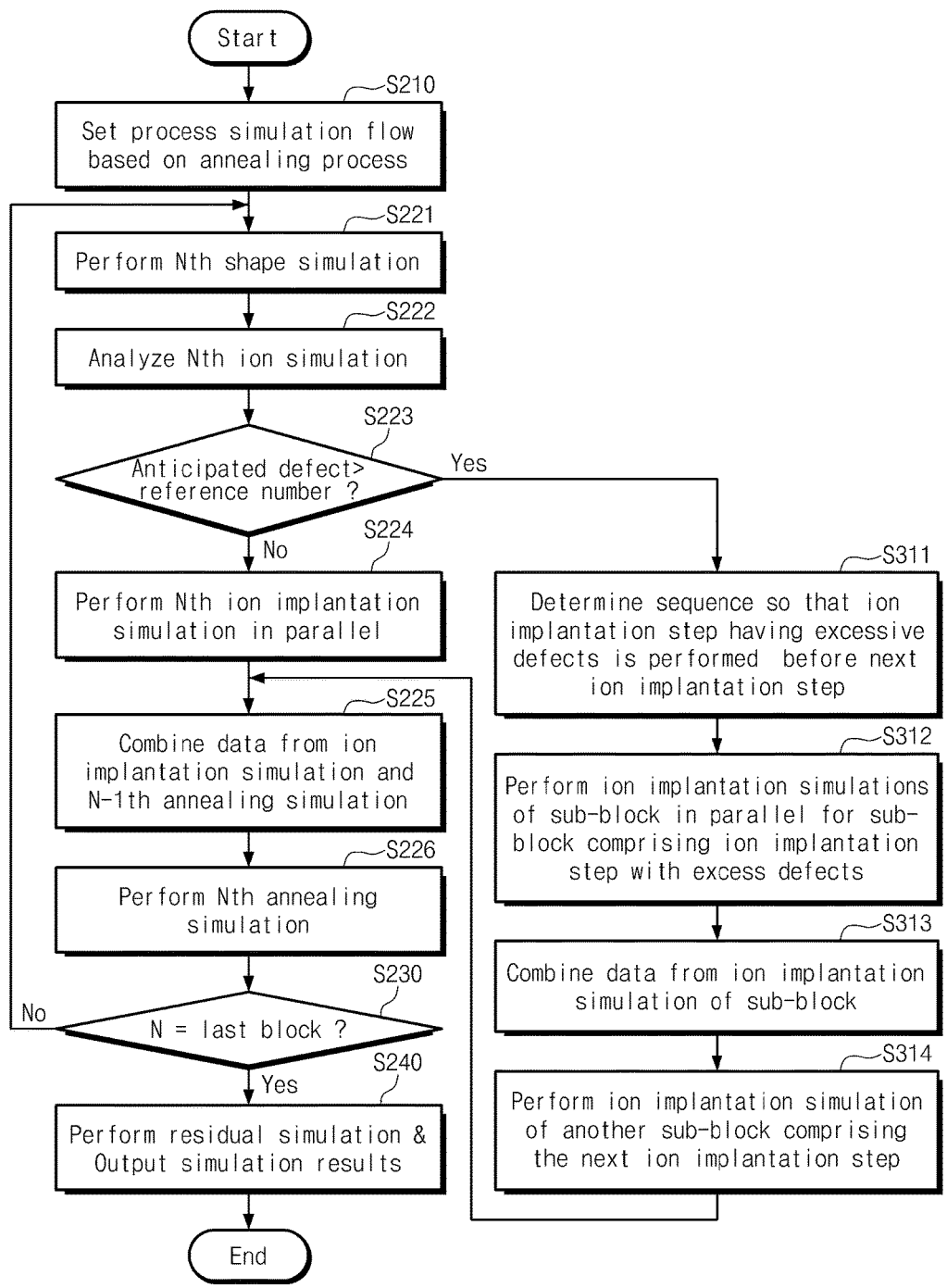
FIG. 9 is a flow chart for describing a simulation method of a simulation device of FIG. 8.

FIG. 9 is a flow chart for describing a simulation method of a simulation device 200 of FIG. 8. A simulation method of FIG. 9 may be similar to the simulation method of FIG. 5. For descriptive convenience, a difference between the simulation methods of FIGS. 5 and 9 will be described, and the same or similar description is thus omitted. For example, operations S224, S225, S226, S230, and S240 of FIG. 9 respectively correspond to operations S122, S123, S124, S130, and S140 of FIG. 5.

In step S210, the process simulator 220 may set a semiconductor process simulation flow based on an annealing simulation. In other words, the process simulator 220 may classify the semiconductor process simulation flow into a plurality of blocks based on the annealing simulation.

In step S221, the shape simulator 221 may perform a shape simulation corresponding to an N-th block.

In step S222, the detect module 222_1 of the ion implantation simulator 222 may analyze a plurality of simulations included in the ion implantation simulation of the N-th block. In step S223, the detect module 222_1 may determine whether there exists a simulation, in which the number of defects exceeds a reference number, from among the plurality of simulations.

If a simulation in which the number of defects is more than the reference number exists, in step S311, the sequence reset module 222_2 may reset the sequence such that the relevant simulation including the excess defects is performed prior to a following simulation.

For example, as described with reference to FIG. 3, it may be assumed that the ion implantation simulation for forming an active area includes first to third simulations. It may be also assumed that a lot of defects are generated by the second simulation.

In this case, to enhance the reliability of the ion implantation simulation, the sequence reset module 222_2 may reset the sequence such that the second simulation is performed prior to the third simulation. Furthermore, to enhance the speed of the ion implantation simulation, the sequence reset module 222_2 may reset the sequence such that the first and second simulations are performed at the same time. In other words, the sequence reset module 222_2 may define the first and second simulations as a first sub-block and the third block as a second sub-block and may reset the sequence such that a simulation operation for the first sub-block is performed prior to the second sub-block.

In step S312, the ion implantation simulator 222 may perform a simulation operation for the first sub-block including the simulation in which a lot of defects occur. In this case, the ion implantation simulator 222 may simultaneously perform the first simulation and the second simulation included in the first sub-block.

In step S313, the ion implantation simulator 222 may combine result data of the first and second simulations to generate defect and impurity distribution data.

In step S314, the ion implantation simulator 222 may perform a simulation operation for the second sub-block based on the defect and impurity distribution data. In this case, since the second simulation in which a lot of defects are generated is performed prior to the third simulation, a change of a defect distribution due to the occurrence of a lot of defects may be applied to result data of the third simulation, and thus the reliability of the ion implantation may be enhanced.

Figure 10:
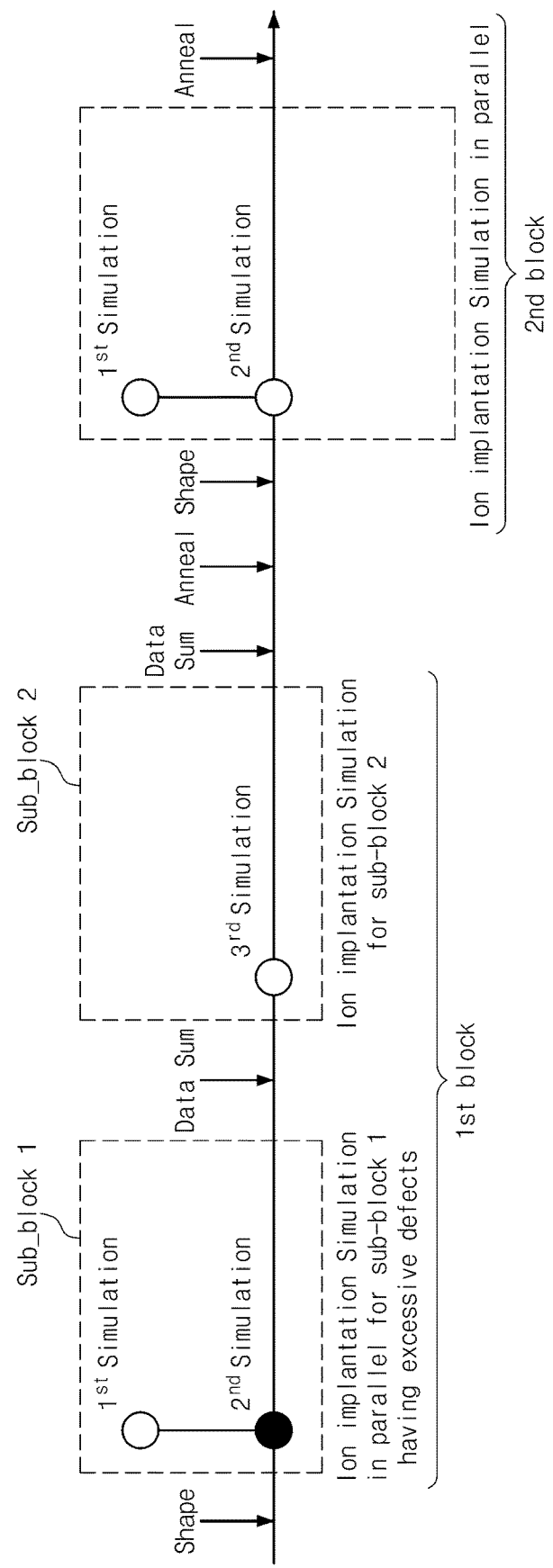
FIG. 10 is a diagram illustrating a simulation method described with reference to FIGS. 8 and 9.

FIG. 10 is a diagram illustrating a simulation method described with reference to FIGS. 8 and 9. For descriptive convenience, it may be assumed that a semiconductor process flow of FIG. 10 includes a first block and a second block, an ion implantation simulation of the first block includes first to third simulations, and an ion implantation simulation of the second block includes first and second simulations. It may be also assumed that a lot of defects are generated by a second simulation of the ion implantation simulation of the first block.

As illustrated in FIG. 10, the simulation method according to an embodiment of the disclosure may define the first and second simulations of the first block as a first sub-block and the third simulation of the first block as a second sub-block and may adjust the sequence such that the first sub-block is simulated prior to the second sub-block. Accordingly, as a simulation in which a lot of defects are generated is performed prior to a following simulation, the reliability of the ion implantation simulation may be enhanced.

In addition, as illustrated in FIG. 10, the first sub-block may include a first simulation and a second simulation, and the first and second simulations may be performed at the same time. Similarly, the first and second simulations of the second block may be performed at the same time. Accordingly, the simulation method according to an embodiment of the disclosure may provide an enhanced simulation speed.

However, the scope and spirit of the disclosure may not be limited thereto. For example, in FIGS. 1 to 10, an embodiment of the disclosure is exemplified as a plurality of simulations included in the ion implantation simulation being performed at the same time to enhance the speed of the ion implantation simulation. However, the disclosure may be applied to perform a shape simulation. This will be more fully described with reference to FIGS. 11 to 12.

Figure 11:
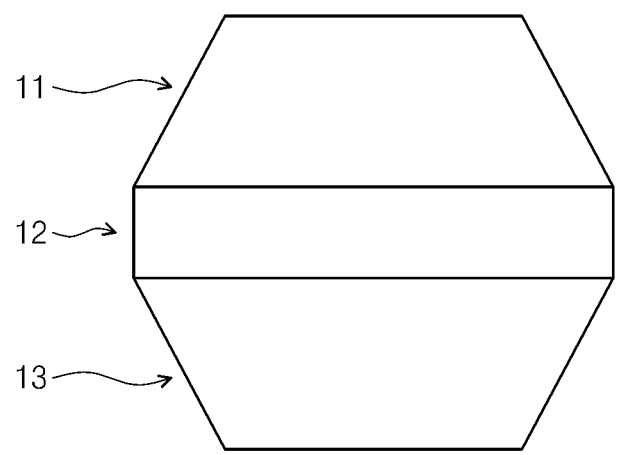
FIGS. 11, 12A and 12B are diagrams for describing a shape simulation method according to another embodiment of the disclosure.
Figure 12A:
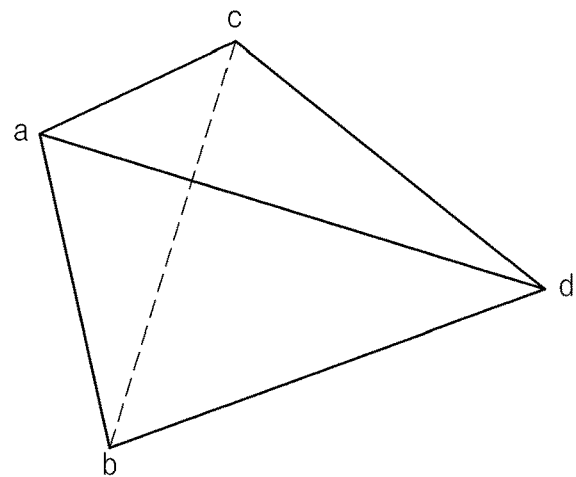
Figure 12B:
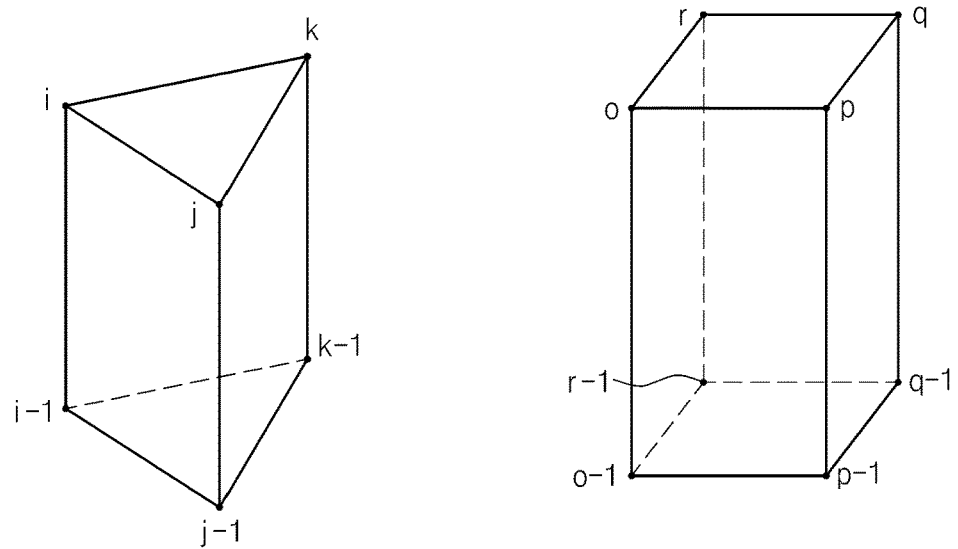

FIGS. 11, 12A and 12B are diagrams for describing a shape simulation method according to another embodiment of the disclosure.

As with an ion implantation simulation operation, a shape simulation operation may include a plurality of simulations. For example, as illustrated in FIG. 11, a shape of a semiconductor device 10 may be divided into a first area 11, a second area 12, and a third area 13. The first to third areas may be simulated in parallel.

In more detail, the shape simulator 121 may perform simulation operations about the first to third areas 11 to 13 in parallel using a mesh structure illustrated in FIGS. 12A and 12B. Afterwards, the shape simulator 121 may combine pieces of result data about the first to third areas 11 to 13 to derive shape data of the semiconductor device 10. As described above, the disclosure may be applied to the shape simulation as well as the ion implantation simulation.

Figure 13:
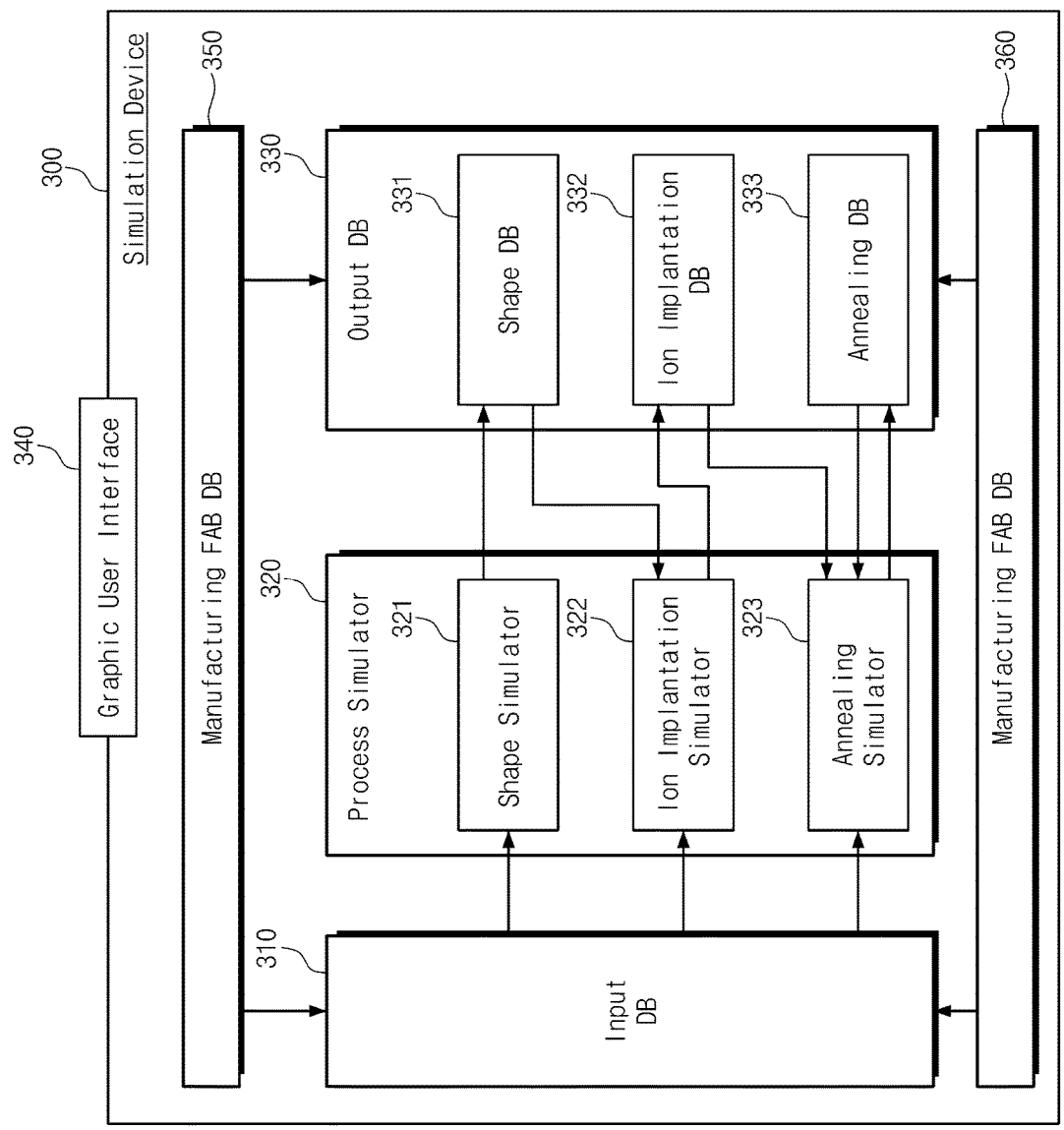
FIG. 13 is a block diagram illustrating a simulation device according to another embodiment of the disclosure.

FIG. 13 is a block diagram illustrating a simulation device 300 according to another embodiment of the disclosure. Input database 310, process simulator 320, shape simulator 321, ion implantation simulator 322, annealing simulator 323, output database 330, shape database 331, ion implantation database 332, and annealing database 333 illustrated by FIG. 13 operate similarly to input database 110, process simulator 120, shape simulator 121, ion implantation simulator 122, annealing simulator 123, output database 130, shape database 131, ion implantation database 132, and annealing database 133 illustrated by FIG. 1. Since a simulation device 300 of FIG. 13 may be similar to the simulation device 100 of FIG. 1, components of FIG. 13 which are similar to those of FIG. 1 may be marked by similar reference numerals, and thus a description thereof is omitted.

Compared with the simulation device 100 of FIG. 1, the simulation device 300 of FIG. 13 may further include a graphic user interface (GUI) 340, a manufacturing data base 350, and a rule data base 360.

The GUI 340 may allow a user to set a semiconductor process flow. That is, the user may adjust a simulation sequence through the GUI 340. For example, the user may select one of the simulation methods described with reference to FIGS. 5 and 9 through the GUI 340.

The manufacturing data base 350 may store data which is generated or measured in manufacturing a semiconductor device. That is, the manufacturing data base 350 may store fluctuation parameters which are generated or measured during an actual manufacturing process and may store fluctuation data indicating a distribution of output data after a semiconductor device is actually manufactured.

The rule data base 360 may store data associated with standards. For example, the rule data base 360 may store product specification data or information about a standard process. Here, the specification data may refer to a quantitative range which is previously defined with respect to each variable or output characteristic data. The information about the standard process may include information associated with a step which a simulation has to include, a sequence of steps, and the like.

Data stored in the manufacturing data base 350 and the rule data base 360 may be applied to an input data base 310 or an output data base 330, and thus the reliability of the simulation operation of the simulation device 300 may be enhanced.

Semiconductor process simulation devices and methods according to embodiments of the disclosure may make it possible to shorten a simulation time without reducing the reliability of simulation.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

What is claimed is:

1. A semiconductor process simulation method executed by a computing system, the method comprising:
classifying a semiconductor process simulation into a plurality of blocks based on an annealing simulation;
performing a shape simulation corresponding to a block selected from the plurality of blocks; and
performing at least two ion implantation simulations among a plurality of ion implantation simulations corresponding to the selected block in parallel, based on result data of the shape simulation corresponding to the selected block.

2. The method of claim 1, wherein the performing of the shape simulation comprises:
obtaining, from an input data base, shape data needed to perform the shape simulation corresponding to the selected block;
performing the shape simulation corresponding to the selected block based on the shape data; and
storing the result data of the shape simulation corresponding to the selected block in an output data base.

3. The method of claim 2, wherein the performing of the at least two ion implantation simulations comprises:
obtaining, from the input data base, ion implantation data needed to perform the plurality of ion implantation simulations corresponding to the selected block and obtaining, from the output data base, the result data of the shape simulation corresponding to the selected block; and
performing the at least two ion implantation simulations in parallel based on the result data of the shape simulation corresponding to the selected block and the ion implantation data.

4. The method of claim 3, wherein the performing of the at least two ion implantation simulations further comprises storing result data of the at least two ion implantation simulations in the output data base.

5. The method of claim 3, wherein the at least two ion implantation simulations are simultaneously performed by different processors, respectively.

6. The method of claim 3, further comprising:
obtaining, from the input data base, annealing data needed to perform an annealing operation and obtaining, from the output data base, first result data about the at least two ion implantation simulations and second result data about an annealing simulation performed at a previous block to the selected block; and
performing the annealing operation corresponding to the selected block, based on the annealing data and the first and second result data.

7. The method of claim 6, wherein the performing of the annealing operation comprises updating the second result data associated with the previous block by storing third result data about the annealing simulation corresponding to the selected block in the output data base.

8. The method of claim 1, further comprising:
determining whether there exists an ion implantation simulation in which a number of defects generated by ion implantation is more than a reference, from among the plurality of ion implantation simulations corresponding to the selected block; and
if there exists the ion implantation simulation in which the number of defects is more than the reference, resetting a sequence of the plurality of ion implantation simulations corresponding to the selected block.

9. The method of claim 8, wherein the resetting comprises:
determining a first ion implantation simulation, in which many defects occur, and a second ion implantation simulation, a defective distribution of which is changed by the first ion implantation simulation, from the plurality of ion implantation simulations; and
determining a sequence of simulations such that a simulation for a first sub-block including the first ion implantation simulation is performed prior to a simulation for a second sub-block including the second ion implantation simulation.

10. The method of claim 9, wherein the first sub-block comprises the first ion implantation simulation and a third ion implantation simulation of which a defect distribution is not changed by the first ion implantation simulation, and wherein the first ion implantation simulation and the third ion implantation simulation are performed at a same time.

11. The method of claim 10, wherein the first to third ion implantation simulations are performed in parallel by different processors, respectively.

12. The method of claim 1, wherein the performing of the shape simulation comprises:
classifying a shape corresponding to the selected block into a plurality of areas;
performing sub-shape simulations corresponding to the plurality of areas in parallel; and
combining result data about the sub-shape simulations performed in parallel to generate data about the shape corresponding to the selected block.

13. A semiconductor process simulation device comprising:
an input data base configured to store input data needed to perform a semiconductor process simulation;
an output data base configured to store output data about an execution result of the semiconductor process simulation; and
a process simulator configured to perform a semiconductor process simulation using the input data base and the output data base, wherein
the process simulator classifies the semiconductor process simulation into a plurality of blocks based on an annealing simulation and performs at least two among a plurality of ion implantation simulations corresponding to a block selected from the plurality of ion implantation simulations in parallel.

14. The semiconductor process simulation device of claim 13, wherein the at least two ion implantation simulations are simultaneously performed by different processors, respectively.

15. The semiconductor process simulation device of claim 13, wherein the process simulator comprises:
a shape simulator configured to perform a shape simulation corresponding to the selected block; and
an ion implantation simulator configured to perform the at least two ion implantation simulations corresponding to the selected block, based on result data about the shape simulation performed by the shape simulator.

16. The semiconductor process simulation device of claim 15, wherein the ion implantation simulator determines whether there exists an ion implantation simulation, in which a number of defects due to ion implantation is more than a reference, from among the plurality of ion implantation simulations and performs a first ion implantation simulation, in which the number of defects is more than the reference, prior to a second ion implantation simulation of which a defect distribution is changed by the first ion implantation simulation.

17. The semiconductor process simulation device of claim 16, wherein the ion implantation simulator simultaneously performs the first ion implantation simulation and a third ion implantation simulation of which a defect distribution is not changed by the first ion implantation simulation.

18. The semiconductor process simulation device of claim 15, further comprising an annealing simulator configured to perform an annealing simulation based on result data about the at least two ion implantation simulations performed in parallel by the ion implantation simulator.

19. The semiconductor process simulation device of claim 18, wherein the ion implantation simulator generates defect distribution data based on the result data about the at least two ion implantation simulations and result data of the annealing simulation.

20. A method comprising:
classifying a semiconductor process simulation into a plurality of blocks based on an annealing simulation;
performing a shape simulation corresponding to a block selected from the plurality of blocks;
performing at least two ion implantation simulations among a plurality of ion implantation simulations corresponding to the selected block in parallel, based on result data of the shape simulation corresponding to the selected block; and
based on results of performing the at least two ion implantation simulations, manufacturing a semiconductor device.

* * * * *